United States Patent
Yuasa et al.

(10) Patent No.: US 7,713,883 B2
(45) Date of Patent: May 11, 2010

(54) MANUFACTURING METHOD OF A SEMICONDUCTOR DEVICE, AND SUBSTRATE PROCESSING APPARATUS

(75) Inventors: Kazuhiro Yuasa, Takaoka (JP); Yasuhiro Megawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 308 days.

(21) Appl. No.: 11/885,869

(22) PCT Filed: Mar. 8, 2006

(86) PCT No.: PCT/JP2006/304429

§ 371 (c)(1), (2), (4) Date: Oct. 29, 2007

(87) PCT Pub. No.: WO2006/095752

PCT Pub. Date: Sep. 14, 2006

(65) Prior Publication Data

US 2008/0124943 A1 May 29, 2008

(30) Foreign Application Priority Data

Mar. 8, 2005 (JP) .............................. 2005-064475

(51) Int. Cl.
H01L 21/31 (2006.01)
H01L 21/469 (2006.01)
(52) U.S. Cl. .............................. 438/770; 257/E21.285; 438/765; 438/769; 438/787
(58) Field of Classification Search ............ 257/E21.24, 257/E21.285; 438/765, 769, 770, 787
See application file for complete search history.

(56) References Cited

U.S. PATENT DOCUMENTS 5,840,368 A * 11/1998 Ohmi ....................... 427/255.4
6,066,508 A 5/2000 Tanabe et al.
6,987,069 B2 * 1/2006 Tanabe et al. ............... 438/770

FOREIGN PATENT DOCUMENTS

JP   A 10-340909   12/1998
JP   A 2000-211998  8/2000
JP   A 2002-110667  4/2002
KR   0310461        12/2001

OTHER PUBLICATIONS

Translation of Korean Office Action issued on Dec. 1, 2009 for Korean Application No. 10-2009-7005917.

* cited by examiner

Primary Examiner—Asok K Sarkar
(74) Attorney, Agent, or Firm—Oliff & Berridge, PLC

(57) ABSTRACT

An object of this invention is to make it possible to suppress early-stage oxidation of a substrate surface prior to oxidation processing, and to remove a natural oxidation film. For this reason, a method is provided comprising the steps of loading a substrate into a processing chamber, supplying a hydrogen-containing gas and an oxygen-containing gas into the processing chamber, and subjecting a surface of the substrate to oxidation processing, and unloading the substrate subjected to oxidation processing from the processing chamber. In the oxidation processing step, the hydrogen-containing gas is introduced in advance into the processing chamber, with the pressure inside the processing chamber set at a pressure that is less than atmospheric pressure, and the oxygen-containing gas is then introduced in the state in which the introduction of the hydrogen-containing gas is continued.

15 Claims, 6 Drawing Sheets

FIG. 7

| PRESSURE INSIDE FURNACE | 35Pa (0.26Torr) | 70Pa (0.53Torr) | 133Pa (1Torr) | 1333Pa (10Torr) | 13330Pa (100Torr) |
|---|---|---|---|---|---|
| ISOTROPY | ○ | ○ | ○ | ○ | × |

FIG. 8

| $H_2/O_2$ FLOW RATE RATIO | 1 | 2 | 2.5 | 5 | 10 |
|---|---|---|---|---|---|
| SELECTIVE OXIDATION | × | ○ | ○ | ○ | △ |

MANUFACTURING METHOD OF A SEMICONDUCTOR DEVICE, AND SUBSTRATE PROCESSING APPARATUS

TECHNICAL FIELD

The present invention relates to a manufacturing method of a semiconductor device and to a substrate processing apparatus for the oxidation processing of a substrate surface.

BACKGROUND ART

As the degree of integration of semiconductor devices has increased, an increase in wiring resistance has become a problem. The materials of gate electrodes primarily used in memory processes have shifted from conventional polysilicon doped with impurities to silicide films that make it possible to lower the resistance value and polymetal structures in which metal materials such as tungsten and the like are stacked on top of polysilicon. Here, silicide films (also referred to as silicate films) are films that are formed by the fusion of metals and silicon. Polymetal structures are structures in which metals are stacked on top of polysilicon, and are structures in which a barrier metal is inserted between the polysilicon and metal in order to prevent silicate formation.

The polymetal structures and silicide films mentioned above will be described using as an example the gate electrodes shown in FIG. 4g. These electrodes are parts of a flash memory or DRAM. Furthermore, FIGS. 4(a) and 4(c) show portions of the structures of flash memories, and FIG. 4(b) shows a portion of the structure of a DRAM.

FIG. 4(a) shows one example in which a polymetal structure is applied to the gate electrode (control electrode) of a flash memory. In order to form a polymetal structure, a surface of a silicon substrate 100 constituting a dynamic layer is thermally oxidized, and a silicon dioxide film ($SiO_2$ film) 110 used for gate insulation is formed; a polysilicon film (poly-Si film) 120 used as a floating gate is deposited on top of this $SiO_2$ film. A poly-Si film 140 used as a gate electrode is stacked on top of this poly-Si film 120, with an $SiO_2/Si_3N_4/SiO_2$ film (insulating film having an ONO structure) 130 or the like interposed as an insulating film. In order to lower the resistance, a tungsten nitride (WN) film 150 is formed as a barrier metal, and a tungsten (W) film 160 is deposited as a metallic thin film on top of this. Subsequently, the stacked films described above are patterned by a dry etching method, so that a structure having a polymetal gate 200 having a stacked structure is formed on the gate region between the source region 80 and drain region 90 as shown in FIG. 4(a).

FIG. 4(b) shows one example in which a polymetal structure is applied to the gate electrode of a DRAM. This example differs from FIG. 4(a) in that there is no poly-Si film 120 or insulating film 130 having an ONO structure; the remaining structure is the same. Furthermore, FIG. 4(c) shows an example in which a silicide film, e.g., a tungsten silicide (WSi) film 170, is used instead of the polymetal structure in FIG. 4(a). This example differs from FIG. 4(a) in that a WSi film 170 is deposited on top of the poly-Si film 140 formed on a surface of the insulating film 130 having an ONO structure.

The dry etching method used to pattern stacked films is a working operation in which a surface of the stacked films is physically shaved off by sputtering. In the polymetal gate structure shown in FIG. 4(a) as an example, damage is inflicted on the surface of the silicon substrate 100 in the source region 80, drain region 90, and the like, and on the side surfaces of the thermal oxidation film ($SiO_2$ film) 110, poly-Si film 120, insulating film 130 having an ONO structure, poly-Si film 140, and the like, and this leads to an increase in the wiring resistance and an increase in the leak current.

In cases in which impurity-doped polysilicon is used as the material of the gate electrode, in order to recover from this damage inflicted on the surface of the silicon substrate 100 and side surfaces of the thermal oxidation film and the like by dry etching, and in order to form a protective film, the moisture generated on the outside of the processing chamber is usually supplied to the interior of the processing chamber at normal pressure or under reduced pressure, and a thermal oxidation film used for protection is formed on the surface of the silicon substrate 100 and the side surfaces of the thermal oxidation film and the like by this moisture (for example, see patent document 1).

Patent document 1: Japanese Laid-Open Patent Application No. 2002-110667

DISCLOSURE OF THE INVENTION

Problems which the Invention is Intended to Solve

However, when a silicide film or polymetal structure is used as the gate electrode, supplying moisture to the processing chamber causes the silicide film constituting the outermost surface or the surface of the metal material used in the polymetal to be easily oxidized in the same manner by this moisture during the formation of the thermal oxidation film used for protection, and the problem of an increase in the wiring resistance is encountered.

Furthermore, there are also methods in which oxidation is accomplished by introducing a hydrogen-containing gas and an oxygen-containing gas directly into the processing chamber under reduced pressure rather than introducing moisture into the processing chamber. However, in such conventional methods, an oxygen-containing gas is supplied in advance of a hydrogen-containing gas, or an oxygen-containing gas is supplied simultaneously with a hydrogen-containing gas, basically in order to suppress surface roughness caused by the thermal etching of the silicon substrate. Accordingly, there is a danger that the silicide film or metal thin film on a surface of the substrate will be oxidized not only during the oxidation processing but also prior to the oxidation processing.

It is an object of the present invention to provide a manufacturing method of a semiconductor device and a substrate processing apparatus in which early-stage oxidation of the substrate surface prior to the oxidation processing can be suppressed, and in which only the silicon substrate surface and layers containing silicon atoms and not containing metal atoms, such as a thermal oxidation film and the like, can be selectively oxidized without oxidizing layers containing metal atoms such as silicide film, metal materials, and the like.

Means Used to Solve the Problems

In one aspect of the present invention, a manufacturing method of a semiconductor device is provided comprising the steps of loading a substrate into a processing chamber, supplying an oxygen-containing gas and a hydrogen-containing gas into the processing chamber and subjecting a surface of the substrate to oxidation processing, and unloading the substrate from the processing chamber following the oxidation processing, wherein, in the oxidation processing step, the hydrogen-containing gas is introduced in advance into the processing chamber, with the pressure inside the processing chamber set at a pressure that is less than atmospheric pressure, and the oxygen-containing gas is then introduced in the state in which the introduction of the hydrogen-containing gas is continued.

In another aspect of the present invention, a manufacturing method of a semiconductor device is provided comprising the steps of loading a substrate in which at least a layer that contains silicon atoms but does not contain metal atoms and a layer that contains metal atoms are exposed at the surface into a processing chamber, supplying an oxygen-containing gas and a hydrogen-containing gas into the processing chamber and subjecting a surface of the substrate to oxidation processing, and unloading the substrate from the processing chamber following the oxidation processing, wherein, in the oxidation processing step, the pressure inside the processing chamber is set at a pressure that is less than atmospheric pressure, and the flow rate ratio B/A of the flow rate B of the hydrogen-containing gas to the flow rate A of the oxygen-containing gas is set at 2 or greater.

EFFECT OF THE INVENTION

In the first aspect of the present invention, a hydrogen-containing gas is introduced in advance of an oxygen-containing gas; accordingly, initial-stage oxidation of the substrate surface prior to the regular oxidation can be suppressed, and the natural oxidation film on the surface of the substrate can be removed.

Furthermore, in cases in which at least a layer that contains silicon atoms but does not contain metal atoms and a layer that contains metal atoms are exposed at the surface of the substrate in accordance with the other aspect of the present invention, only the layer that contains silicon atoms but does not contain metal atoms can be selectively oxidized without oxidizing the layer that contains metal atoms.

BEST MODE FOR CARRYING OUT THE INVENTION

The present inventors discovered that even if the hydrogen-containing gas is introduced into the processing chamber in advance of the oxygen-containing gas, no localized volume expansion occurs in the processing chamber as long as the interior of the processing chamber is placed under a reduced pressure. Furthermore, the present inventors discovered that the oxidation reaction of the silicide film or metal material (layer that contains metal atoms) exposed at the surface can be suppressed by placing the interior of the processing chamber under a reduced pressure and introducing the hydrogen-containing gas in advance of the oxygen-containing gas into the processing chamber after the substrate is loaded into the processing chamber. Moreover, the present inventor discovered that the natural oxidation film that is formed on a surface of the substrate can also be removed in this case. In addition, the present inventor discovered conditions under which the recovery from damage to the surface of the silicon substrate and to the side surfaces of the thermal oxidation film and the like (layer that contains silicon atoms but does not contain metal atoms) exposed by dry etching can be accomplished, and a thermal oxidation film that protects these layers can be formed, while maintaining reducibility with respect to the silicide film and metal material, by adding a small amount of an oxygen-containing gas to the processing chamber kept at a reduced pressure and provided with a reducing atmosphere created by a hydrogen-containing gas. The present invention is based on these findings, which have been discovered by the present inventors.

Embodiments of the present invention will be described below with reference to the attached figures.

FIG. 3 shows a batch type vertical semiconductor manufacturing apparatus (oxidation apparatus) as one example of the construction of a substrate processing apparatus used to work the present invention.

The reaction furnace 20 has a reaction tube 21 made of quartz. A boat 2 used as a substrate holder is inserted into the processing chamber 4 (hereafter also referred to simply as a furnace) formed by this reaction tube 21. The boat 2 is constructed so as to hold a plurality of silicon wafers 1 in a plurality of stages at intervals (substrate pitch intervals) in a substantially horizontal state. The bottom of the reaction tube 21 is open in order to allow insertion of the boat 2; this open part can be tightly closed by a sealing cap 22. The boat 2 is carried on a heat insulating cap 25, and the heat insulating cap 25 is attached to the rotating mechanism 27 via a rotating shaft 26. A resistance-heating heater 5 is disposed around the reaction tube 21 as a heating source. Connected to the reaction tube 21 are an oxygen supply line 7 used as an oxygen-containing gas supply line that supplies oxygen ($O_2$) gas as an oxygen-containing gas to the silicon wafers 1 from the upstream side of the disposition region of the silicon wafers 1, and a hydrogen supply line 8 used as a hydrogen-containing gas supply line that supplies hydrogen ($H_2$) gas as a hydrogen-containing gas to the silicon wafers 1 from the upstream side of the disposition region of the silicon wafers 1.

The oxygen supply line 7 is connected to an oxygen gas supply source 41, and the hydrogen supply line 8 is connected to a hydrogen gas supply source 42. The oxygen supply line 7 and hydrogen supply line 8 are disposed so that these lines pass through the ceiling wall 31 of the reaction tube 21. The gas jetting openings of the oxygen supply line 7 and hydrogen supply line 8 that pass through in this way are oriented downward, and are arranged so that oxygen gas and hydrogen gas are each caused to jet downward.

The supply lines 7 and 8 are provided with electromagnetic valves 6a and 6b which are used to supply the gases and stop the supply of the gases, and mass flow controllers (flow rate control devices) 12a and 12b which allow the adjustment of the flow rates of the respective gases. Furthermore, an exhaust line 23 which discharges the processing gases is connected to the reaction tube 21, a vacuum pump 3 is connected to this exhaust line 23, and the apparatus has a structure that maintains the interior of the reaction tube 21 at a specified pressure. During substrate processing, the interior of the reaction tube 21 is maintained by the vacuum pump 3 at a specified pressure that is lower than atmospheric pressure (reduced pressure); this pressure control is accomplished by a controller 24 used as a control means.

The controller 24 also controls the operation of a rotating mechanism 27, the electromagnetic valves 6a and 6b, the mass flow controllers 12a and 12b, and other units that constitute the oxidation apparatus.

Next, a method for performing oxidation processing on a surface of a substrate as one step of a semiconductor device manufacturing process using the oxidation apparatus described above will be described with reference to FIGS. 1 and 3.

FIG. 1 shows one example of the process sequence of the oxidation processing in the present invention. Furthermore, in the following description, the operation of the respective parts constituting the oxidation apparatus is controlled by the controller 24.

One batch of silicon wafers 1 is transferred to the boat 2. The interior of the reaction furnace 20 is heated to a specified temperature (substrate loading temperature), e.g., a specified temperature in the range of 300 to 600° C., and this state is maintained. The plurality of silicon wafers 1 placed into the boat 2 are loaded into the processing chamber 4 of the reaction furnace 20 whose heated state is maintained, and the interior of the reaction tube 21 is tightly closed by the sealing cap 22 (substrate loading step). Here, at least a layer which contains silicon atoms but does not contain metal atoms and a layer which contains metal atoms are exposed at a surface of the silicon wafers 1 loaded in the boat 2. A silicon single crystal substrate, poly-Si film, $Si_3N_4$ film, or $SiO_2$ film may be used as the layer which contains silicon atoms but does not contain metal atoms. Furthermore, a silicide film, metal film, or metal oxide film may be used as the layer which contains metal atoms.

The interior of the processing chamber 4 into which the silicon wafers 1 have been loaded is evacuated by the vacuum pump 3, and the pressure inside the furnace is controlled by the controller 24 to a specified pressure that is lower than atmospheric pressure (101.3 kPa) (reaction chamber pressure reduction step). This specified pressure is the pressure inside the processing chamber 4 (advance introduction pressure P) when the hydrogen gas is introduced in advance, as will be described later, and is greater than the oxidation processing pressure Q that will be described later. Furthermore, the boat 2 is caused to rotate at a specified rotational speed by the rotating mechanism 27.

After the pressure inside the processing chamber 4 has been reduced to the advance introduction pressure P, hydrogen gas is directly introduced into the processing chamber 4 in advance of the oxygen gas (advance introduction of hydrogen) from the hydrogen supply line 8 prior to the temperature increase step described later. Subsequently, the flow of hydrogen gas is continued (hydrogen-containing gas flow step) up to a point prior to the atmospheric pressure leak step described later. The introduction of hydrogen gas is performed from a point prior to the step of increasing the temperature inside the processing chamber 4; however, it is sufficient if the introduction of hydrogen gas is performed at least from the step of increasing the temperature inside the processing chamber 4.

In the state in which the supply of hydrogen gas is continued, the temperature inside the processing chamber 4 is increased from the substrate loading temperature, which is the temperature maintained at the time that the silicon wafers are loaded, to the oxidation processing temperature (temperature increase step). A specified temperature in the range of 800 to 900° C. may be indicated as an example of the oxidation processing temperature.

Following the temperature increase, the temperature of the processing chamber 4 as a whole is controlled by the controller 24 so that this temperature is stably maintained at the specified oxidation processing temperature (temperature stabilization step).

When the temperature of the processing chamber 4 as a whole has been stabilized, or while the temperature of the processing chamber 4 as a whole is stabilized, the pressure inside the furnace is controlled by the controller 24 so that this pressure is a specified oxidation processing pressure Q that is lower than the advance introduction pressure P. The oxidation processing pressure is set at 1333 Pa (10 torr) or less.

Subsequently, in the state in which the introduction of hydrogen gas is continued, oxygen gas is directly introduced into the processing chamber 4 from the oxygen supply line 7 (subsequent introduction of oxygen). In this case, the flow rate ratio B/A of the flow rate B of hydrogen gas to the flow rate A of oxygen gas is set at 2 or greater.

As a result of the introduction of oxygen gas, oxygen gas and hydrogen gas react in an atmosphere under a reduced pressure that is heated by the resistance-heating heater 5, and reaction species such as ions and the like are produced; oxidation of the silicon wafers 1 is caused to proceed by these reaction species. Oxidation processing is performed by causing oxygen gas to flow for a specified time in the state in which the introduction of hydrogen gas is continued (oxidation processing step). Furthermore, in the present invention, oxidation processing is performed under hydrogen-rich conditions. Here, the term "hydrogen-rich" refers to a case in which $B/A \geqq 2$, where A is the flow rate of oxygen gas, and B is the flow rate of hydrogen gas.

Subsequently, the introduction of oxygen gas is stopped in the state in which the introduction of hydrogen gas is continued, and the oxidation processing is ended. Specifically, the introduction of oxygen gas is performed in a step in which the temperature inside the processing chamber is at least maintained at the oxidation processing temperature as indicated by the arrow-symbol interval of the oxygen-containing gas flow shown in FIG. 1 (oxygen-containing gas flow step).

When the oxidation processing of the silicon wafers 1 is ended, the residual gas inside the processing chamber 4 is removed via the exhaust line 23 by purging with an inert gas, vacuum evacuation by the vacuum pump 3, or the like (purging step), and the interior of the processing chamber 4 is set at a high degree of vacuum, e.g., a pressure of 0.01 Pa or less. In the state in which the pressure inside the processing chamber 4 is maintained at a pressure of 0.01 Pa or less, the temperature inside the furnace is lowered from the oxidation processing temperature to a specified substrate loading temperature, e.g., a specified temperature in the range of 300 to 600° C. (temperature lowering step). Furthermore, during this period as well, hydrogen gas is caused to flow continuously without any modification, and the supply of hydrogen gas is stopped following the lowering of the temperature. Furthermore, the hydrogen gas may also be stopped at the oxidation processing temperature prior to the lowering of the temperature, after the oxidation processing is ended.

As is shown by the arrow-symbol interval of the hydrogen-containing gas flow shown in FIG. 1, the introduction of hydrogen gas is continued from before the step of increasing the temperature in the processing chamber 4 until after the completion of the step of lowering the temperature in the processing chamber 4. Alternatively, the introduction of hydrogen gas may also be continued from at least the step of increasing the temperature in the processing chamber 4 up to a point prior to the lowering of the temperature in the processing chamber 4, or until the step of lowering the temperature is completed.

After the supply of hydrogen gas is stopped, the pressure inside the processing chamber 4 is returned to atmospheric pressure (101.3 kPa) by supplying an inert gas such as $N_2$ or the like to the processing chamber 4 (atmospheric pressure leak step). Subsequently, the boat 2 is unloaded from the processing chamber 4 of the reaction furnace 20, and the silicon wafers 1 that have been subjected to oxidation processing are unloaded (substrate unloading step). The boat 2 is caused to wait in a specified position until the cooling of all of the silicon wafers 1 supported in the boat 2. When the silicon wafers 1 held in the boat 2 that is caused to wait have cooled to a specified temperature, the silicon wafers 1 are recovered by a substrate transfer mechanism or the like.

In this way, the process sequence in oxidation under hydrogen-rich conditions obtained by the advance introduction of hydrogen is completed.

Furthermore, a furnace temperature of 600 to 1100° C., preferably 800 to 900° C., a furnace pressure of 13.3 to 1333 Pa (0.1 to 10 torr), preferably 13.3 to 133 Pa (0.1 to 1 torr), an $H_2$ flow rate of 0.5 to 5.0 slm, preferably 1.0 to 2.0 slm, an $O_2$ flow rate of 0.05 to 2.0 slm, preferably 0.05 to 0.5 slm, and an $H_2/O_2$ flow rate ratio of 2 to 5, preferably 4 to 5, may be cited as an example of preferred processing conditions of the oxidation processing in the present embodiment. Oxidation processing is performed with the respective processing conditions maintained at specified values within these ranges.

In the present embodiment, oxidation is performed at 500° C. or greater under hydrogen-rich conditions with the advance introduction of hydrogen; conventionally, however, oxidation has not been performed under hydrogen-rich conditions with the advance introduction of hydrogen.

The reason for this is that it was believed that if $O_2$ were to be subsequently introduced into a reaction system at atmospheric pressure and at a temperature of 500° C. or greater following the advance introduction of hydrogen, and the $H_2O_2$ flow rate ratio in this case were set at 2.0 or greater (hydrogen-rich), a chain reaction would be induced by the reaction heat, and this would be accompanied by localized volume expansion, thus entering the explosive range and rendering the process dangerous in a reaction system using a quartz vessel.

However, it was demonstrated that localized volume expansion during processing can be prevented by placing the reaction system under a reduced pressure. It is inferred that the reason for this is that in processing under a reduced pressure, a large exhaust rate is constantly obtained by means of the vacuum pump in the reaction system, so that pressure fluctuations giving rise to localized volume expansion are absorbed. Furthermore, in particular, it was also demonstrated that the explosive range can be avoided by reducing the pressure of the reaction system to 1333 Pa (10 torr) or less. The reason for this is that the probability of collision between $H_2$ and $O_2$ in the reaction system is reduced by reducing the pressure of the reaction system to a value that is equal to or less than the value described above, so that the quantity of heat generated by the heat of the reaction that is necessary in order to reach a chain reaction is not supplied.

This will be described with reference to FIG. 6. FIG. 6 is a diagram showing pressure fluctuations in the furnace in a case in which $H_2$ and $O_2$ are supplied to the furnace, with the $H_2/O_2$ flow rate ratio varied under conditions which are such that the $H_2/O_2$ flow rate ratio is 2 or greater (hydrogen-rich), in the state in which the interior of the furnace is evacuated by the vacuum pump. The horizontal axis shows the $H_2/O_2$ flow rate (slm), and the vertical axis shows the pressure (Pa) inside the furnace. Furthermore, the $H_2$ flow rate was fixed at 1.0 slm, and only the $O_2$ flow rate was varied as follows: 0 slm, 0.1 slm, 0.2 slm, 0.4 slm, 0.5 slm.

It is seen from FIG. 6 that when the temperature inside the furnace is set at 300° C., the pressure increases monotonically depending on the $O_2$ flow rate. This indicates that no reaction is taking place in the furnace. On the other hand, it is seen that when the temperature inside the furnace is set at 600° C., almost no increase in pressure is observed. This indicated that some type of reaction is taking place in the furnace. Furthermore, in cases in which the temperature inside the furnace is set at a temperature greater than 600° C., e.g., 800° C., it is likewise the case that almost no increase in pressure is observed. Moreover, it was demonstrated that no pressure fluctuation occurs in the furnace, either when the pressure inside the furnace is set at 133 Pa (1 torr), or when this pressure is set at 1333 Pa (10 torr). It is seen from these facts that if the pressure inside the furnace is set at 1333 Pa (10 torr) or less during the oxidation processing, no pressure fluctuation occurs inside the furnace, and there is no danger of an explosion due to an increased-rate reaction.

Furthermore, it was also demonstrated that if the pressure inside the furnace is set at 1333 Pa (10 torr) or less, isotropy is maintained with no dependency on plane orientation. This will be described with reference to FIG. 7. FIG. 7 shows the results obtained when it was determined whether or not isotropy was maintained in a case in which an oxidation film was formed on silicon substrates having different crystal plane orientations (110), (100) while the temperature inside the furnace was kept at 800 to 900° C., the $H_2/O_2$ flow rate ratio was kept at 2 or greater, and the pressure inside the furnace was varied. Here, furthermore, isotropy is expressed by the ratio T1/T2 (hereafter referred to as isotropy (110)/(100)) of the film thickness T1 of the oxidation film formed on a silicon substrate having a crystal plane orientation of (110) to the film thickness T2 of the oxidation film formed on a silicon substrate having a crystal plane orientation of (100); in cases in which the isotropy (110)/(100)=1.00 to 1.10, it is judged that isotropy is maintained, while in cases in which the isotropy (110)/(100)>1.10, it is judged that isotropy is not maintained. In FIG. 7, indicates that isotropy is maintained, and x indicates that isotropy is not maintained.

It is seen from FIG. 7 that isotropy is maintained in cases in which the pressure inside the furnace is set at 1333 Pa (10 torr) or less, but that isotropy is not maintained in cases in which the pressure inside the furnace is set at 13330 Pa (100 torr) or greater. The reason for this is thought to be as follows: namely, in cases in which the pressure inside the furnace is set at 1333 Pa (10 torr) or less, reaction species such as ions and the like are generated by the reaction of $H_2$ and $O_2$ inside the furnace, and these reaction species contribute to oxidation; however, in cases in which the pressure inside the furnace is set at 13330 Pa (100 torr) or greater, such reaction species are not generated. It is seen from this as well that it is preferable to set the pressure inside the furnace at 1333 Pa (10 torr) or less.

The actions and effects of the present embodiment will be cited below in (A) through (E).

(A) In the present embodiment, since hydrogen gas is introduced in advance of oxygen gas, the following actions and effects are obtained.

(1) Oxidation of the silicide film, metal films, and the like prior to the oxidation processing can be prevented.

Advance introduction of oxygen, which is an oxidizing species, caused oxygen-induced oxidation to proceed. However, by preferentially introducing hydrogen, it is possible to maintain the interior of the processing chamber 4 in an atmosphere of a reducing gas that contains no oxidizing species, and oxidation can be prevented.

(2) Early-stage oxidation of the silicon substrate, a surface of the poly-Si film, and the like can be suppressed.

Advance introduction of oxygen, which is an oxidizing species, caused oxygen-induced oxidation to proceed. However, by preferentially introducing hydrogen, it is possible to maintain the interior of the processing chamber 4 in an atmosphere of a reducing gas that contains no oxidizing species, and oxidation can be prevented.

(3) The naturally oxidized films on the silicon substrate, on a surface of the poly-Si film, and the like can be removed.

Advance introduction of oxygen, which is an oxidizing species, caused oxygen-induced oxidation to proceed. However, by preferentially introducing hydrogen, it is possible to maintain the interior of the processing chamber 4 in an atmosphere of a reducing gas that contains no oxidizing species, and oxidation can be prevented. In addition, by setting the pressure at a specified pressure (advance introduction pressure P), it is possible to remove natural oxidation films by sublimation.

(B) Furthermore, in the present embodiment, the advance introduction pressure P inside the processing chamber 4 when hydrogen gas is introduced in advance is set at a larger value than the oxidation processing pressure Q that is maintained when oxygen gas is introduced in the state in which the introduction of hydrogen gas is continued. Accordingly, surface roughness caused by thermal etching can be prevented.

A problem that must be dealt with when a silicon surface is subjected to oxidation processing is the relationship between the oxidation processing temperature and the pressure inside the reaction tube 21. In cases in which the oxidation processing temperature is a high temperature of 850° C. to 900° C., if a state is encountered in which the pressure inside the reaction tube 21 is as low as approximately 0.01 Pa (high vacuum), there is a possibility that surface roughness of the silicon known as thermal etching may arise. It is believed that this surface roughness may cause dissociation of the silicon to occur in a state of high temperature and low oxygen partial pressure, and this causes the device characteristics to deteriorate.

Accordingly, thermal etching may be prevented by not reducing the pressure any more than necessary, and setting the pressure at a value that is a little higher than a high vacuum, in the state in which the interior of the furnace is placed in a hydrogen atmosphere prior to oxidation processing. In the present embodiment, the value of the advance introduction pressure P is set at a pressure that is higher than the pressure Q during oxidation processing, so that the advance introduction pressure P inside the reaction tube 21 will not be reduced to around 0.01 Pa in the vicinity of the temperature prior to oxidation processing. In cases in which the oxidation processing temperature is around 850° C. or less, it is preferred that the value of the advance introduction pressure P be set at 133 to 13330 Pa; in cases in which the oxidation processing temperature is around 900° C. or less, it is preferred that the value of the advance introduction pressure P be set at 6500 to 13330 Pa. It has also been demonstrated that there is a similar tendency to prevent thermal etching in cases in which the interior of the furnace is placed in an $N_2$ atmosphere.

Thus, although there are differences according to the oxidation processing temperature, roughness of the silicon surface caused by thermal etching that might conceivably occur during oxidation processing of the silicon surface can be effectively prevented by controlling the pressure inside the furnace so that this pressure is maintained at the advance introduction pressure P which is considerably higher than the oxidation processing pressure Q prior to oxidation processing, rather than lowering this pressure all at once by vacuum evacuation from atmospheric pressure (101.3 kPa) that is maintained at the time of introduction into the furnace to the oxidation processing pressure that is maintained prior to the step of increasing the temperature inside the processing chamber 4.

(C) Furthermore, in the present embodiment, since the conditions used when oxidation processing is performed are set as hydrogen-rich conditions, the following actions and effects are obtained.

(1) Selective Oxidation

The oxidation of layers containing metal atoms such as the silicide film, metal films, and the like (hereafter also referred to simply as metals) is prevented, and a thermal oxidation film can be selectively formed to protect layers that contain silicon atoms but do not contain metal atoms, such as the silicon substrate, a surface of the poly-Si film, and the like (hereafter also referred to simply as silicon). Specifically, in cases in which a very small amount of $O_2$ is added to the $H_2$ of the reducing atmosphere, regions are obtained in which the selective oxidation of silicon and metals is possible.

In an atmosphere of $O_2$ alone, oxidation proceeds on both silicon and metal surfaces in a manner that depends on temperature and pressure. Furthermore, in an atmosphere of $H_2$ alone, oxidizing species are not present at normal temperature and normal pressure; accordingly, oxidation of silicon and metal surfaces does not proceed. However, when the temperature is increased and the pressure is reduced in an $H_2$ atmosphere, the natural oxidation film present on silicon and metal surfaces undergoes sublimation. Oxidation and sublimation are phenomena that are induced by the same energy; however, whether oxidation or sublimation proceeds is determined by the mixture ratio, i.e., flow rate ratio, of the $O_2$ that forms the oxidizing atmosphere and $H_2$ that forms the reducing atmosphere. The probability of a sublimation reaction occurring increases as the flow rate ratio of $H_2$ to $O_2$ becomes larger. The energy required for the formation of an oxidation film or for sublimation differs in silicon and metals. Selectivity at which silicon is oxidized but metals are not oxidized can be obtained if the flow rate ratio of $O_2$ and $H_2$ is varied and hydrogen-rich conditions are set, i.e., if the flow rate ratio B/A of the $H_2$ flow rate B to the $O_2$ flow rate A is set at 2 or greater.

In particular, if the pressure inside the processing chamber 4 is set at 1333 Pa (10 torr) or less, preferably 133 Pa (1 torr) or less, and the flow rate ratio B/A is set at 2 or greater, preferably 4 or greater, only layers that contain silicon atoms but do not contain metal atoms can be selectively oxidized without oxidizing layers that contain metal atoms, especially tungsten.

This will be described with reference to FIG. 8. FIG. 8 shows the results obtained when it was determined whether or not selective oxidation could be performed in a case in which tungsten was processed as a layer that contains metal atoms, and silicon was processed as a layer that contains silicon atoms but does not contain metal atoms while the temperature inside the furnace was kept at 800 to 900° C., the pressure inside the furnace was kept at 13.3 Pa (0.1 torr) to 1333 Pa (10 torr), and the $H_2/O_2$ flow rate ratio was varied. Furthermore, it was judged that selective oxidation could be achieved in cases in which tungsten was not oxidized but silicon was oxidized, and it was judged that selective oxidation could not be achieved in cases in which both silicon and tungsten were oxidized. In FIG. 8, ○ indicates that selective oxidation could be achieved, and x indicates that selective oxidation could not be achieved. Also, Δ indicates that neither silicon nor tungsten was oxidized. Furthermore, the processing time was set at 20 to 30 minutes.

It is seen from FIG. 8 that selective oxidation cannot be achieved in cases in which the $H_2/O_2$ flow rate ratio is set at 1. When changes in the surface of the tungsten were observed with an SEM in this case, needle-form crystals referred to as whiskers were observed (abnormal oxidation). It is seen that selective oxidation is possible in cases in which the $H_2/O_2$ flow rate ratio is set at 2 to 5. In this case, silicon was sufficiently oxidized, and no abnormal oxidation of tungsten was observed. In cases in which the $H_2/O_2$ flow rate ratio was set at 10, tungsten was not oxidized, and silicon likewise showed hardly any oxidation. It is thought that the cause of this was that the amount of oxygen added was too small, and the oxidation rate was extremely low, indicating that this was not a practical level. It is seen from these findings that if the $H_2/O_2$ flow rate ratio is set in the range of 2 to 5, silicon alone can be selectively oxidized without oxidizing tungsten, and that the silicon oxidation rate can be maintained at a practical level.

(2) Damage Recovery

Furthermore, in the present embodiment, as a result of the addition of an extremely small amount of $O_2$ in a reducing atmosphere of $H_2$, it is possible to recover from damage caused by the dry etching on a surface of the silicon substrate 100 and the surface layers of the side surfaces of the $SiO_2$ film 110, which is a thermal oxidation film, as well as of the poly-Si film 120, the insulating film 130 having an ONO structure, and the poly-Si film 140. Moreover, in order to recover from damage caused by dry etching, it is preferable that the temperature at the time of the introduction of $O_2$ be set at 800° C. or greater.

(3) Suppression of Oxidation in the Horizontal Direction

While the rate-determining step of conventional oxidation caused by moisture (wet oxidation) is diffusion, in the case of oxidation caused by reaction species generated by the reaction of oxygen and hydrogen in the present embodiment, there is no diffusion, and the reaction is close to a surface reaction; accordingly, oxidation in the horizontal direction is suppressed. In wet oxidation, the oxidizing species are small molecules of $H_2O$, and these diffuse through the oxidation film. For example, in a polymetal structure, as is shown in FIG. 5, not only is there oxidation of the surfaces (side surfaces) of the poly-Si films 120, 140 and the like, but there is also, for example, oxidation that proceeds in the horizontal direction (indicated by the arrow 51) along the lower part of the poly-Si film 120 as a result of the diffusion of $H_2O$ into the interface between the poly-Si film 120 and the $SiO_2$ film 110, which is a gate oxidation film. The diffusion of $H_2O$ is determined by temperature and time. When the processing is performed for a long time at a high temperature, diffusion is rapid, and oxidation in the horizontal direction proceeds quickly. On the other hand, in the case of the reaction species in the present embodiment, since the lifetime is short, the system returns to a steady state during diffusion through the film, the reaction species are oxygen and the like, and the oxidizing power is weak. Accordingly, the progression of oxidation in the horizontal direction is suppressed. Consequently, in the case of the reaction species in the present embodiment, oxidation is a reaction that occurs only in the surface layers (side surface layers).

(4) Stabilization of Interface State Between Silicon Substrate and $SiO_2$

An $H_2$ sintering effect is obtained by the advance introduction of $H_2$. For example, in a polymetal structure, as is shown in FIG. 5, a thin gate oxidation film (in part, an oxide nitride film) is present in the interface 52 between the silicon substrate 100 and the $SiO_2$ film 110. Ordinarily, in cases in which only an $SiO_2$ film 110 is formed, a transition region containing numerous unbonded species is present in the interface between the $SiO_2$ film 110 and the silicon substrate 100, and this transition region acts as an electron capturing center; accordingly, this has an effect on various characteristics, beginning with the threshold voltage. Ordinarily, after the metal wiring step is completed, modification of the interface 52 between the $SiO_2$ film 110 and silicon substrate 100 is also performed by $H_2$ annealing referred to as $H_2$ sintering processing, which is performed in order to embed various types of defects. An effect similar to that of $H_2$ sintering is generated by introducing hydrogen in advance, and by performing oxidation under hydrogen-rich conditions. Furthermore, since this is a process performed in the immediate vicinity of the gate, the efficiency of hydrogen termination is also improved.

Accordingly, the state of the interface 52 between a surface of the silicon substrate 100 and the $SiO_2$ film 110 can be stabilized.

(5) Thin Film Formation at High Temperatures

In oxidation under hydrogen-rich conditions, the oxidation rate is lower than in the case of oxidation under oxygen-rich conditions. Conventionally, therefore, thin film formation at high temperatures has been possible. As the processing temperature increases, stress in the film is relaxed, so that a high withstand voltage is obtained. The reason for the slowing of the oxidation rate is the same as that in the case of the selectivity described in (C)(1) above. As a result of the hydrogen-rich conditions, there are fewer oxidation reactions and more sublimation reactions. Furthermore, as the hydrogen-rich conditions become more prevalent, oxidation no longer proceeds, and a state in which sublimation proceeds is entered via an equilibrium state. Accordingly, at the same oxidation temperature and pressure, the oxidation rate becomes lower in the case of hydrogen-rich conditions, and oxidation films with a smaller thickness can be manufactured at higher temperatures while the film quality is improved. Furthermore, the adhesion of contaminants to a surface of the substrate can be reduced, and the substrate surface can easily be maintained in a clean state. In addition, when a plurality of silicon wafers 1 are processed using a vertical semiconductor manufacturing apparatus, the variation in the thickness of the oxidation film that accompanies the variation in the hydrogen concentration on the respective silicon wafers 1 can be suppressed.

(6) Rounding Oxidation (Corner Rounding)

A rounding effect designed to reduce the concentration of the electric field can be expected to be achieved by the reaction species in the present embodiment. For example, when a silicon surface having corners is oxidized, a rearrangement of the atoms occurs; here, it is inferred that the surface free energy is temporarily increased by the high-energy reaction species in the present embodiment, and that fluid motion of the surface silicon takes place. When the surface energy is boosted by the energy from the outside and causes rearrangement to take place, this rearrangement moves to the form that is lowest in terms of energy. The shape having the lowest surface energy is a spherical shape. In accordance with this reasoning, it is inferred that rounding oxidation is possible in principle as a result of the fact that rearrangement accompanied by fluid motion of the silicon in the surface occurs at the same time as oxidation is caused by the reaction species in the present embodiment. For example, as is shown in FIG. 5, a shape with a rounding 53 designed to reduce the concentration of the electric field may be expected to be obtained in the boundary end between the poly-Si film 120 and the $SiO_2$ film 110.

(D) Furthermore, in the present embodiment, since the introduction of oxygen gas is stopped in the state in which the introduction of hydrogen gas is continued, the oxidation of layers that contain metal atoms following oxidation can be prevented. Furthermore, since the introduction of hydrogen gas is continued from a point prior to the step of increasing the temperature inside the processing chamber 4 to a point following the step of lowering the temperature inside the processing chamber, and the introduction of oxygen gas is performed at least during the step in which the temperature inside the processing chamber 4 is maintained at the processing temperature, the oxidation of layers that contain metal atoms can be prevented from a point prior to the initiation of temperature increase to a point following the completion of the lowering of the temperature.

(E) Furthermore, in the present embodiment, differences in the growth rates of oxidation films on silicon surfaces having different plane orientations (crystal plane orientations) on silicon substrates formed by various semiconductor wafer processing steps can be conspicuously reduced compared to conventional oxidation methods, and the plane orientation dependency of the oxidation rate can be reduced. Moreover, oxidation films can also be grown on $Si_3N_4$ films in the same manner as on silicon. Specifically, in addition to selective oxidation between silicon substrates and metal materials, isotropic oxidation can also be performed between different silicon crystal orientations, and between $Si_3N_4$ films and silicon substrates.

FIG. 2 shows a comparative diagram of film thickness data for oxidation films formed on a surface of a silicon substrate using the oxidation processing method of the present embodiment and the oxidation processing method of a comparative example. Here, the film thicknesses of oxidation films formed on the surfaces of silicon substrates having different crystal plane orientations of (110) and (100) are also compared. The oxidation conditions of the present embodiment were set as hydrogen-rich conditions with hydrogen being introduced in advance ($H_2$ flow rate/$O_2$ flow rate=1.0 slm/0.2 slm). The oxidation condition in the comparative example were oxygen-rich conditions ($H_2$ flow rate/$O_2$ flow rate=0.4 slm/1.0 slm) with oxygen being introduced in advance. In all cases, the temperature inside the furnace was fixed at 850° C., the pressure inside the furnace was fixed at 35 Pa, and the processing time was also fixed.

It is seen from the same figure that in the oxidation processing method of the present embodiment, the film thickness of the oxidation film is 23.82 angstroms in the case of a silicon substrate having a crystal plane orientation of (110), and 23.63 angstroms in the case of a silicon substrate having a crystal plane orientation of (100). On the other hand, in the oxidation processing method of the comparative example, it is seen that the film thickness of the oxidation film is 83.52 angstroms in the case of a silicon substrate having a crystal plane orientation of (110), and 73.55 angstroms in the case of a silicon substrate having a crystal plane orientation of (100), thus indicating that the oxidation processing method of present embodiment allows the formation of thinner films than the oxidation processing method of the comparative example. Furthermore, in a case in which the oxidation processing method of the present embodiment and the oxidation processing method of the comparative example were both performed with the pressure inside the furnace set at normal pressure and the other oxidation conditions set in the same manner as the oxidation conditions described above, the same amount of $H_2O$ gas was formed as in the case of 0.4 slm. It may be said from these findings that the oxidation rate can be slowed under $H_2$-rich conditions even at the same moisture content and with the temperature and pressure set at the same values. Furthermore, in the oxidation processing method of the present embodiment, it is also seen from the fact that there is almost no difference in the film thickness of the oxidation film between a silicon substrate having a crystal plane orientation of (110) and a silicon substrate having a crystal plane orientation of (100) (difference in film thickness: 0.19 angstroms) that there is no plane orientation dependency, and that isotropy is maintained (isotropy of (110)/(100)=1.01). In the oxidation processing method of the comparative example, on the other hand, it is seen that there is a relatively large difference in the film thickness of the oxidation film between a silicon substrate having a crystal plane orientation of (110) and a silicon substrate having a crystal plane orientation of (100) (difference in film thickness: 10 angstroms), thus indicating that there is plane orientation dependency, and that isotropy is not maintained (isotropy of (110)/(100)=1.14).

Furthermore, when a tungsten thin film was processed under the hydrogen-rich conditions with advance introduction of hydrogen in the present embodiment, and the sheet resistance before and after processing was checked, the resistance before processing was 6.3Ω/□, and the resistance after processing was 4.5Ω/□, so that no increase was seen, thus confirming that the oxidation of tungsten had not progressed. On the other hand, when a tungsten thin film was processed under oxygen-rich conditions with the advance introduction of oxygen in the comparative example, and the sheet resistance was checked before and after processing, an increase was seen after processing, thus confirming that the oxidation of tungsten had progressed.

Thus, in the present embodiment, differences in the growth rates of oxidation films on silicon surfaces having different plane orientations on silicon substrates formed by various silicon substrate processing steps can be conspicuously reduced compared to conventional oxidation methods, and thinner films can be formed. Furthermore, as a result of the advance introduction of hydrogen, the oxidation of silicide films and metal thin films can be prevented, the initial-stage oxidation of the silicon substrate and the surfaces of polycrystalline silicon films can be prevented, and natural oxidation films can be removed. Moreover, by setting the conditions as hydrogen-rich conditions in which the hydrogen/oxygen flow rate ratio is 2.0 or greater when oxygen is introduced while the introduction of hydrogen is continued, it is possible to selectively form a thermal oxidation film that protects the silicon substrate and surface of the polycrystalline film while preventing the oxidation of silicide films and metal thin films.

Furthermore, in the embodiment described above, a case was described in which oxygen ($O_2$) gas was used as an oxygen-containing gas. However, at least one gas selected from the group including oxygen ($O_2$) gas, nitrous oxide ($N_2O$) gas, and nitrogen monoxide (NO) gas may be used. Furthermore, a case was described in which hydrogen ($H_2$) gas was used as a hydrogen-containing gas. However, at least one gas selected from the group including hydrogen ($H_2$) gas, deuterium (heavy hydrogen) gas, ammonia ($NH_3$) gas, and methane ($CH_4$) gas may be used.

Furthermore, for example, the layer that contains silicon atoms but does not contain metal atoms that is exposed at a surface of the substrate may be at least one layer selected from the group including a silicon single crystal substrate, a polycrystalline silicon film (poly-Si film) formed by CVD, a silicon nitride film ($Si_3N_4$ film), a silicon dioxide film ($SiO_2$ film), and an $SiO_2/Si_3N_4/SiO_2$ film (insulating film having an ONO structure). Cases are also included in which a plurality of silicon layers having different crystal plane orientations are formed on the silicon single crystal substrate. In particular, the present invention is especially effective in cases in which the surface of the silicon substrate that is subjected to oxidation processing has different crystal orientation planes, or has polycrystalline silicon formed by CVD, or has a silicon nitride.

Furthermore, the layer that contains metal atoms that is exposed at the surface of the substrate may, for instance, be at least one layer selected from the group including silicide films, metal films, and metal oxide films. Here, such silicide films constitute at least one film selected from the group including tungsten silicide (WSi) films, aluminum silicide (AlSi) films, nickel silicide (NiSi) films, molybdenum silicide ($MoSi_2$) films, cobalt silicide ($CoSi_2$) films, and titanium silicide ($TiSi_2$) films. For example, metal films constitute at least one film selected from the group including tungsten (W) films, aluminum (Al) films, nickel (Ni) films, ruthenium (Ru)

films, and copper (Cu) films. Furthermore, for instance, a W/WN/poly-Si structure may be cited as one example of a polymetal structure (metal/barrier metal/poly-Si). Moreover, metal oxide films may be oxide films of these metals.

Preferable aspects of the present invention are described below.

A first aspect is a manufacturing method of a semiconductor device comprising the steps of loading a substrate into a processing chamber, supplying an oxygen-containing gas and a hydrogen-containing gas into the processing chamber and subjecting a surface of the substrate to oxidation processing, and unloading the substrate from the processing chamber following the oxidation processing, wherein, in the oxidation processing step, the hydrogen-containing gas is introduced in advance into the processing chamber, with the pressure inside the processing chamber set at a pressure that is less than atmospheric pressure, and the oxygen-containing gas is then introduced in the state in which the introduction of the hydrogen-containing gas is continued.

In this aspect, since a hydrogen-containing gas is introduced in advance, early-stage oxidation of the substrate surface prior to [regular] oxidation can be suppressed, and natural oxidation films can be removed.

A second aspect is the manufacturing method of a semiconductor device of the first aspect, the oxidation processing step comprising the steps of: increasing the temperature inside the processing chamber to a processing temperature from the temperature at the time at which the substrate is loaded, maintaining the temperature inside the processing chamber at the processing temperature, and lowering the temperature inside the processing chamber from the processing temperature to the temperature at the time at which the substrate is unloaded, wherein the introduction of a hydrogen-containing gas is performed at least from the step of increasing the temperature inside the processing chamber, and the introduction of an oxygen-containing gas is performed at least during the step of maintaining the temperature inside the processing chamber at the processing temperature.

In this aspect, since the introduction of a hydrogen-containing gas is performed at least from the step of increasing the temperature inside the processing chamber, and the introduction of an oxygen-containing gas is performed at least during the step of maintaining the temperature inside the processing chamber at the processing temperature, early-stage oxidation of the substrate surface during temperature increase can be suppressed, and natural oxidation films can be removed.

A third aspect is the manufacturing method of a semiconductor device of the first aspect, the oxidation processing step comprising the steps of: increasing the temperature inside the processing chamber to a processing temperature from the temperature at the time at which the substrate is loaded, maintaining the temperature inside the processing chamber at the processing temperature, and lowering the temperature inside the processing chamber from the processing temperature to the temperature at the time at which the substrate is unloaded, wherein the introduction of a hydrogen-containing gas is performed from a point prior to the step of increasing the temperature inside the processing chamber, and the introduction of an oxygen-containing gas is performed at least during the step of maintaining the temperature inside the processing chamber at the processing temperature.

In this aspect, since the introduction of a hydrogen-containing gas is performed from a point prior to the step of increasing the temperature inside the processing chamber, and the introduction of an oxygen-containing gas is performed at least during the step of maintaining the temperature inside the processing chamber at the processing temperature, early-stage oxidation of the substrate surface from a point prior to temperature increase can be suppressed, and natural oxidation films can be removed.

A fourth aspect is the manufacturing method of a semiconductor device of the first aspect, wherein the pressure inside the processing chamber at the time that a hydrogen-containing gas is introduced in advance in the oxidation processing step is set at a greater pressure than the pressure at the time that an oxygen-containing gas is introduced in the state in which the introduction of a hydrogen-containing gas is continued.

In this aspect, since the pressure inside the processing chamber at the time that a hydrogen-containing gas is introduced in advance in the oxidation processing step is set at a greater pressure than the pressure at the time that an oxygen-containing gas is introduced in the state in which the introduction of a hydrogen-containing gas is continued, roughness of the substrate surface caused by thermal etching can be prevented.

A fifth aspect is the manufacturing method of a semiconductor device of the first aspect, wherein at least a layer that contains silicon atoms but does not contain metal atoms, and a layer that contains metal atoms are exposed at a surface of the substrate.

In this aspect, in cases in which at least a layer that contains silicon atoms but does not contain metal atoms, and a layer that contains metal atoms are exposed at the surface of the substrate, early-stage oxidation of the layer that contains silicon atoms but does not contain metal atoms prior to [regular] oxidation can be suppressed, natural oxidation films can be removed, and oxidation of the layer that contains metal atoms can be prevented.

A sixth aspect is the manufacturing method of a semiconductor device of the fifth aspect, wherein the flow rate ratio B/A of the flow rate B of the hydrogen-containing gas to the flow rate A of the oxygen-containing gas in the oxidation processing step is set at 2 or greater.

In this aspect, since the flow rate ratio B/A of the flow rate B of the hydrogen-containing gas to the flow rate A of the oxygen-containing gas is set at 2 or greater, an oxidation film for protecting the layer that contains silicon atoms but does not contain metal atoms can be selectively formed while preventing the oxidation of the layer that contains metal atoms. Furthermore, it is possible to recover from damage to the surface layer received in the steps prior to the oxidation processing step. Moreover, oxidation in the horizontal direction perpendicular to the direction of thickness of the layer that contains silicon atoms but does not contain metal atoms can be suppressed. Furthermore, the interface state between the substrate surface and the layer that contains silicon atoms but does not contain metal atoms can be stabilized. In addition, thin films can be manufactured at a higher temperature while improving the film quality. Furthermore, in cases in which the layer that contains silicon atoms but does not contain metal atoms has ends where the electric field tends to be concentrated, rounding designed to reduce the concentration of the electric field can be formed on these ends.

A seventh aspect is the manufacturing method of a semiconductor device of the sixth aspect, wherein the pressure inside the processing chamber at the time that an oxygen-containing gas is introduced in the state in which the introduction of a hydrogen-containing gas is continued in the oxidation processing step is set at 1333 Pa (10 torr) or less.

In this aspect, since the pressure inside the processing chamber at the time that an oxygen-containing gas is introduced in the state in which the introduction of a hydrogen-containing gas is continued is set at 1333 Pa (10 torr) or less, the probability of a reaction between oxygen and hydrogen is lowered, and the explosive range can be avoided; furthermore, isotropic oxidation is possible.

An eighth aspect is the manufacturing method of a semiconductor device of the fifth aspect, wherein a hydrogen-containing gas is introduced in advance into the processing chamber in the oxidation processing step, an oxygen-containing gas is then introduced in the state in which the introduction of a hydrogen-containing gas is continued, and the introduction of an oxygen-containing gas is subsequently stopped in the state in which the introduction of a hydrogen-containing gas is continued.

In this aspect, since the introduction of an oxygen-containing gas is stopped in the state in which the introduction of a hydrogen-containing gas is continued, oxidation of the layer that contains metal atoms following [regular] oxidation can be prevented.

A ninth aspect is the manufacturing method of a semiconductor device of the fifth aspect, the oxidation processing step comprising the steps of: increasing the temperature inside the processing chamber to a processing temperature from the temperature at the time at which the substrate is loaded, maintaining the temperature inside the processing chamber at the processing temperature, and lowering the temperature inside the processing chamber from the processing temperature to the temperature at the time at which the substrate is unloaded, wherein the introduction of a hydrogen-containing gas is continued from at least the step of increasing the temperature inside the processing chamber to the point at which the step of lowering of the temperature inside the processing chamber is completed, and the introduction of an oxygen-containing gas is performed at least during the step of maintaining the temperature inside the processing chamber at the processing temperature.

In this aspect, since the introduction of a hydrogen-containing gas is continued from at least the step of increasing the temperature inside the processing chamber to the point at which the step of lowering of the temperature; inside the processing chamber is completed, and the introduction of an oxygen-containing gas is performed at least during the step of maintaining the temperature inside the processing chamber at the processing temperature, oxidation of the layer that contains metal atoms can be prevented from the time that temperature increase is initiated to the time that lowering of the temperature is completed.

A tenth aspect is the manufacturing method of a semiconductor device of the fifth aspect, the oxidation processing step comprising the steps of: increasing the temperature inside the processing chamber to a processing temperature from the temperature at the time at which the substrate is loaded, maintaining the temperature inside the processing chamber at the processing temperature, and lowering the temperature inside the processing chamber from the processing temperature to the temperature at the time at which the substrate is unloaded, wherein the introduction of a hydrogen-containing gas is continued from a point prior to the step of increasing the temperature inside the processing chamber to a point following the step of lowering the temperature inside the processing chamber, and the introduction of an oxygen-containing gas is performed at least during the step of maintaining the temperature inside the processing chamber at the processing temperature.

In this aspect, since the introduction of a hydrogen-containing gas is continued from a point prior to the step of increasing the temperature inside the processing chamber to a point following the step of lowering the temperature inside the processing chamber, and the introduction of an oxygen-containing gas is performed at least during the step of maintaining the temperature inside the processing chamber at the processing temperature, oxidation of the layer that contains metal atoms can be prevented from a point prior to the time that temperature increase is initiated to a point after the time that lowering of the temperature is completed An eleventh aspect is the manufacturing method of a semiconductor device of the fifth aspect, wherein the layer that contains silicon atoms but does not contain metal atoms is at least one layer selected from the group including a silicon single crystal substrate, polycrystalline silicon film (poly-Si film), silicon nitride film ($Si_3N_4$ film), and silicon dioxide film ($SiO_2$ film), and the layer that contains metal atoms is at least one layer selected from the group including a silicide film, a metal film, and a metal oxide film.

In cases in which the oxidation processing of a substrate having such layers is performed, the following problems arise: namely, the layer that contains silicon atoms but does not contain metal atoms is especially susceptible to early-stage oxidation prior to [the regular] oxidation, and the layer that contains metal atoms is susceptible to oxidation. In the present aspect, however, such problems are solved.

A twelfth aspect is a manufacturing method of a semiconductor device comprising the steps of loaded into a processing chamber a substrate in which at least a layer that contains silicon atoms but does not contain metal atoms and a layer that contains metal atoms are exposed at the surface, supplying an oxygen-containing gas and a hydrogen-containing gas into the processing chamber and subjecting a surface of the substrate to oxidation processing, and loading the substrate subjected to oxidation processing from the processing chamber, wherein, in the oxidation processing step, the pressure inside the processing chamber is set at a pressure that is less than atmospheric pressure, and the flow rate ratio B/A of the flow rate B of the hydrogen-containing gas to the flow rate A of the oxygen-containing gas is set at 2 or greater.

In this aspect, since a substrate in which at least a layer that contains silicon atoms but does not contain metal atoms and a layer that contains metal atoms are exposed at the surface is subjected to oxidation processing by supplying an oxygen-containing gas and a hydrogen-containing gas whose flow rate ratio B/A is set at 2 or greater, an oxidation film for protecting the layer that contains silicon atoms but does not contain metal atoms can be selectively formed while preventing the oxidation of the layer that contains metal atoms. Furthermore, it is also possible to recover from damage to the surface layers that is received in the steps preceding the oxidation processing step. Moreover, oxidation in the horizontal direction perpendicular to the direction of thickness of the layer that contains silicon atoms but does not contain metal atoms can be suppressed. Furthermore, the interface state between the surface of the substrate and the layer that contains silicon atoms but does not contain metal atoms can be stabilized. In addition, thin films can be formed at higher temperatures while improving the film quality. Furthermore, in cases in which the layer that contains silicon atoms but does not contain metal atoms has ends where the electric field tends to be concentrated, rounding designed to reduce the concentration of the electric field can be formed on these ends.

A thirteenth aspect is the manufacturing method of a semiconductor device of the twelfth aspect, wherein the pressure inside the processing chamber and the flow rate ratio B/A are set in the oxidation processing step in a range in which only the layer that contains silicon atoms but does not contain metal atoms is selectively oxidized without any oxidation of the layer that contains metal atoms.

In this aspect, since the pressure inside the processing chamber and the flow rate ratio B/A are set in a range in which only the layer that contains silicon atoms but does not contain metal atoms is selectively oxidized without any oxidation of the layer that contains metal atoms, only the layer that contains silicon atoms but does not contain metal atoms can be selectively oxidized without any oxidation of the layer that contains metal atoms.

A fourteenth aspect is the manufacturing method of a semiconductor device of the twelfth aspect, wherein, in the oxidation processing step, the pressure inside the processing chamber is set at 1333 Pa (10 torr) or less, and the flow rate ratio B/A is set at 2 or greater.

In this aspect, since the pressure inside the processing chamber is set at 1333 Pa (10 torr) or less, and the flow rate ratio B/A is set at 2 or greater, only the layer that contains silicon atoms but does not contain metal atoms can be selectively oxidized without any oxidation of the layer that contains metal atoms.

A fifteenth aspect is the manufacturing method of a semiconductor device of the twelfth aspect, wherein the pressure inside the processing chamber is set at 1333 Pa (10 torr) or less, and the flow rate ratio B/A is set at a value ranging from 2 or greater to 5 or less.

In this aspect, since the pressure inside the processing chamber is set at 1333 Pa (10 torr) or less, and the flow rate ratio B/A is set at a value ranging from 2 or greater to 5 or less, only the layer that contains silicon atoms but does not contain metal atoms can be selectively oxidized without any oxidation of the layer that contains metal atoms, and the oxidation rate can be kept within a practical range.

A sixteenth aspect is a substrate processing apparatus comprising a processing chamber in which a substrate is processed, an oxygen-containing gas supply line which supplies an oxygen-containing gas into the processing chamber, a hydrogen-containing gas supply line which supplies a hydrogen-containing gas into the processing chamber, an exhaust line which evacuates the interior of the processing chamber, a vacuum pump which is connected to the exhaust line and which evacuates the interior of the processing chamber to a vacuum, and a controller which performs a control action so that the pressure inside the processing chamber is set at a pressure that is less than atmospheric pressure, the hydrogen-containing gas is introduced in advance into the processing chamber, and the oxygen-containing gas is then introduced in the state in which the introduction of the hydrogen-containing gas is continued.

In this aspect, since control is performed using a controller so that a hydrogen-containing gas is introduced in advance, early-stage oxidation of the substrate surface prior to [the regular] oxidation can easily be suppressed, and natural oxidation films can easily be removed.

A seventeenth aspect is a substrate processing apparatus comprising a processing chamber for processing a substrate in which at least a layer that contains silicon atoms but does not contain metal atoms and a layer that contains metal atoms are exposed at the surface, an oxygen-containing gas supply line which supplies an oxygen-containing gas into the processing chamber, a hydrogen-containing gas supply line which supplies a hydrogen-containing gas into the processing chamber, an exhaust line which evacuates the interior of the processing chamber, a vacuum pump which is connected to the exhaust line and which evacuates the interior of the processing chamber to a vacuum, and a controller which performs a control action so that the pressure inside the processing chamber is set at a pressure that is less than atmospheric pressure, and so that the flow rate ratio B/A of the flow rate B of the hydrogen-containing gas to the flow rate A of the oxygen-containing gas supplied to the processing chamber is set at 2 or greater.

In this aspect, since control is performed using a controller so that a substrate in which at least a layer that contains silicon atoms but does not contain metal atoms and a layer that contains metal atoms are exposed at the surface is subjected to oxidation processing under hydrogen-rich processing in which the flow rate ratio B/A is set at 2 or greater, an oxidation film for protecting the layer that contains silicon atoms but does not contain metal atoms can be selectively formed with ease while easily preventing oxidation of the layer that contains metal atoms. Furthermore, it is possible to recover from damage to the surface layer received in steps preceding the oxidation processing step. Moreover, oxidation in the horizontal direction perpendicular to the direction of thickness of the layer that contains silicon atoms but does not contain metal atoms can easily be suppressed. In addition, the interface state between the substrate surface and the layer that contains silicon atoms but does not contain metal atoms can easily be stabilized. Furthermore, thin films can easily be formed at higher temperatures while improving the film quality. Moreover, in cases in which the layer that contains silicon atoms but does not contain metal atoms has ends in which the electric field tends to be concentrated, rounding designed to reduce the concentration of the electric field can easily be formed on these ends.

BRIEF DESCRIPTION OF THE DRAWINGS

FIG. 7 is a diagram showing the results obtained when a judgement was made as to whether or not isotropy was maintained in a case in which oxidation films were formed on silicon substrates with the pressure inside the furnace varied; and FIG. 8 is a diagram showing the results obtained when a judgement was made as to whether or not selective oxidation could be achieved in a case in which tungsten and silicon were processed with the $H_2/O_2$ flow rate ratio varied.

KEY

Figure 1:
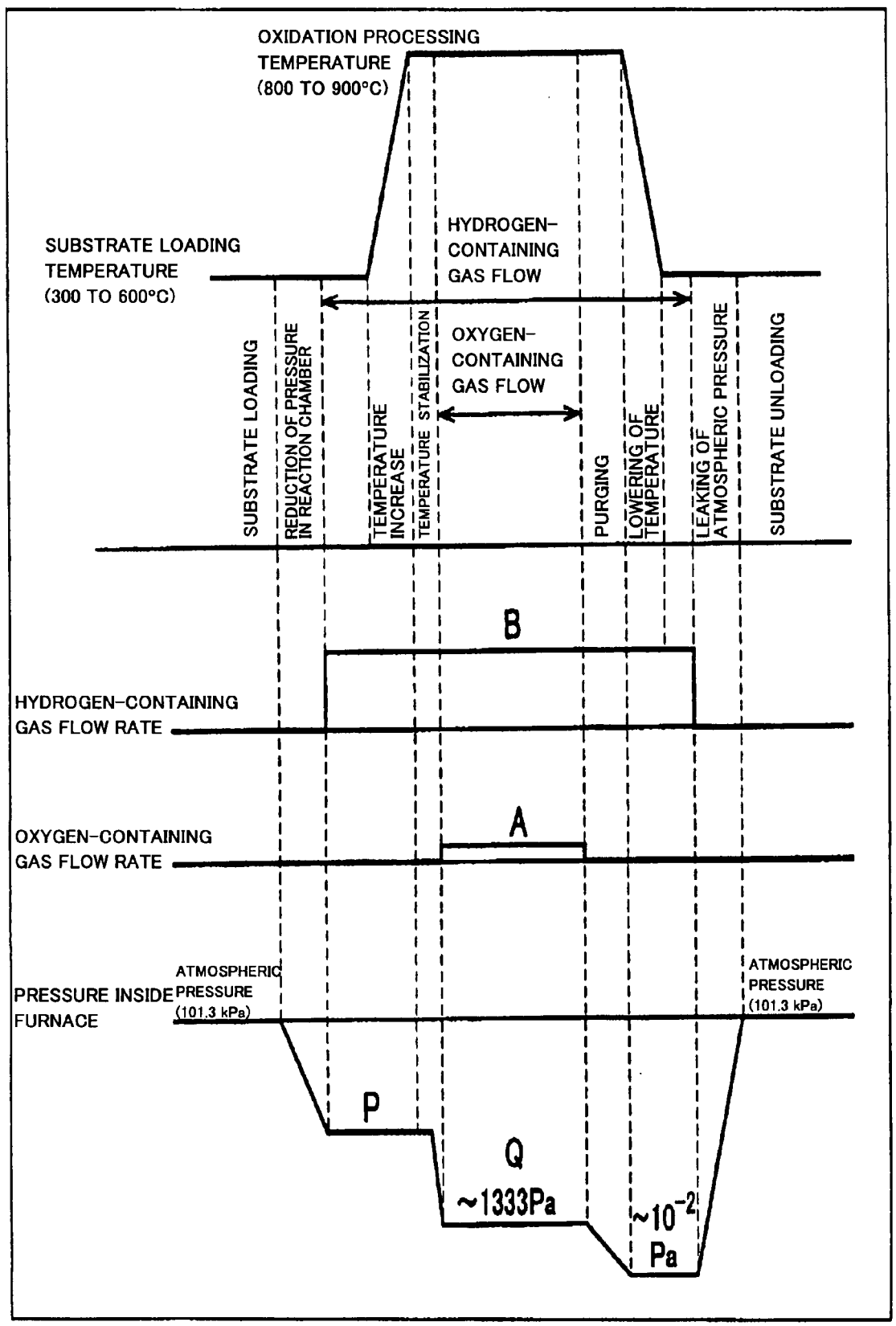
FIG. 1 is a process sequence diagram showing one example of the oxidation processing according to an embodiment.
Figure 2:
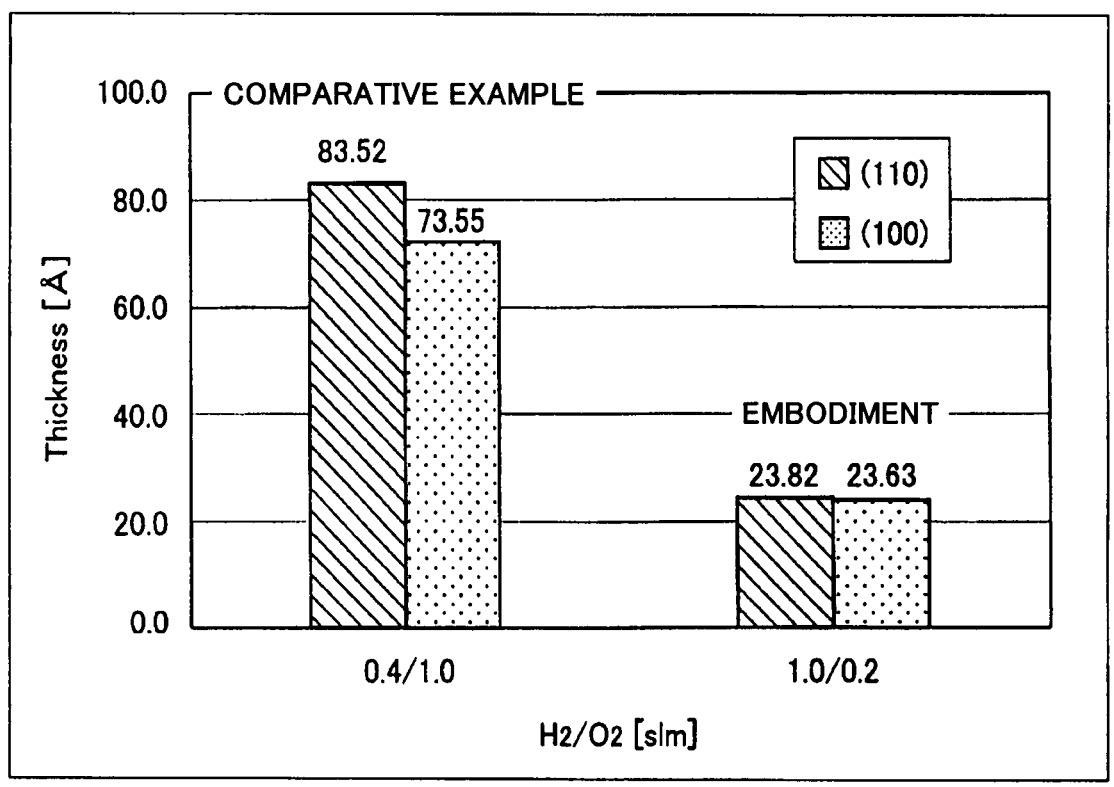
FIG. 2 is a comparative diagram of film thickness data for oxidation films obtained in a case in which such oxidation films were formed on silicon substrates using the oxidation processing methods of the embodiment and a comparative example.
Figure 3:
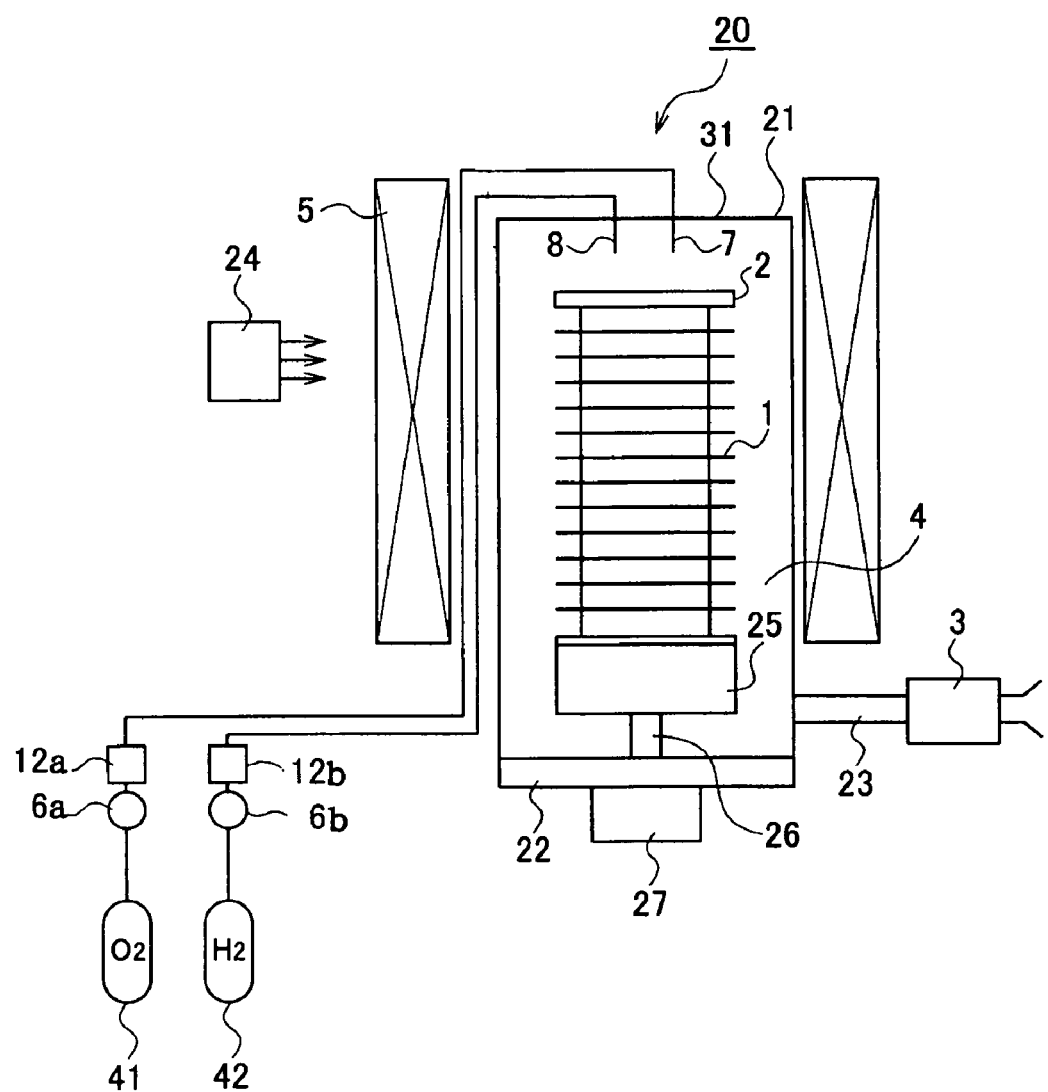
FIG. 3 is an explanatory diagram showing the construction of a vertical semiconductor manufacturing apparatus used as substrate processing apparatus according to the embodiment.
Figure 4:
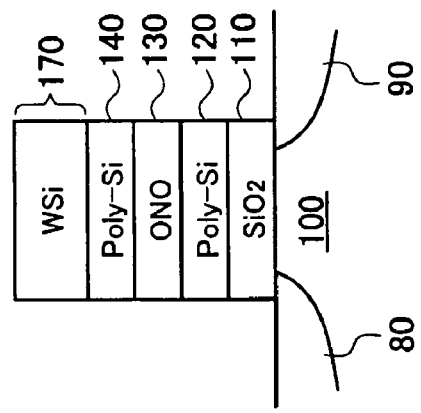
FIG. 4 is a laminated structure diagram illustrating various types of gates of semiconductor devices.
Figure 4:
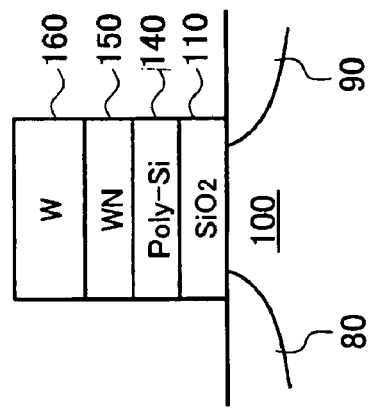
Figure 4:
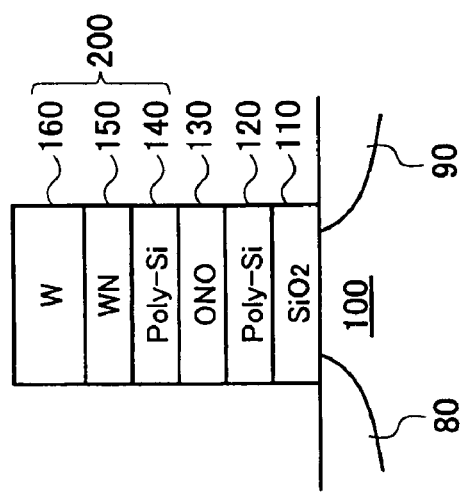
Figure 5:
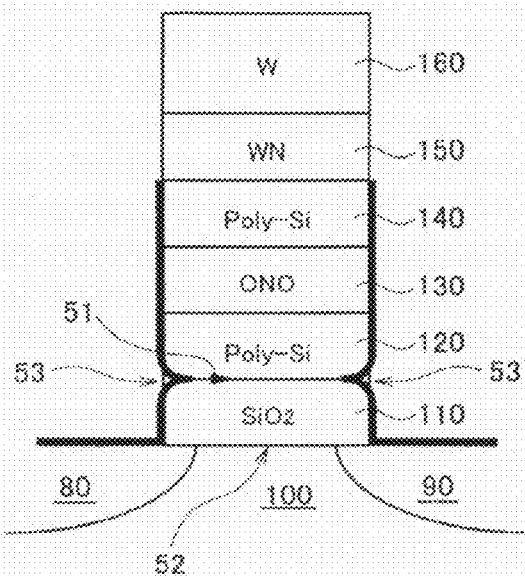
FIG. 5 is an explanatory diagram showing the effect of hydrogen-rich conditions according to the embodiment.
Figure 6:
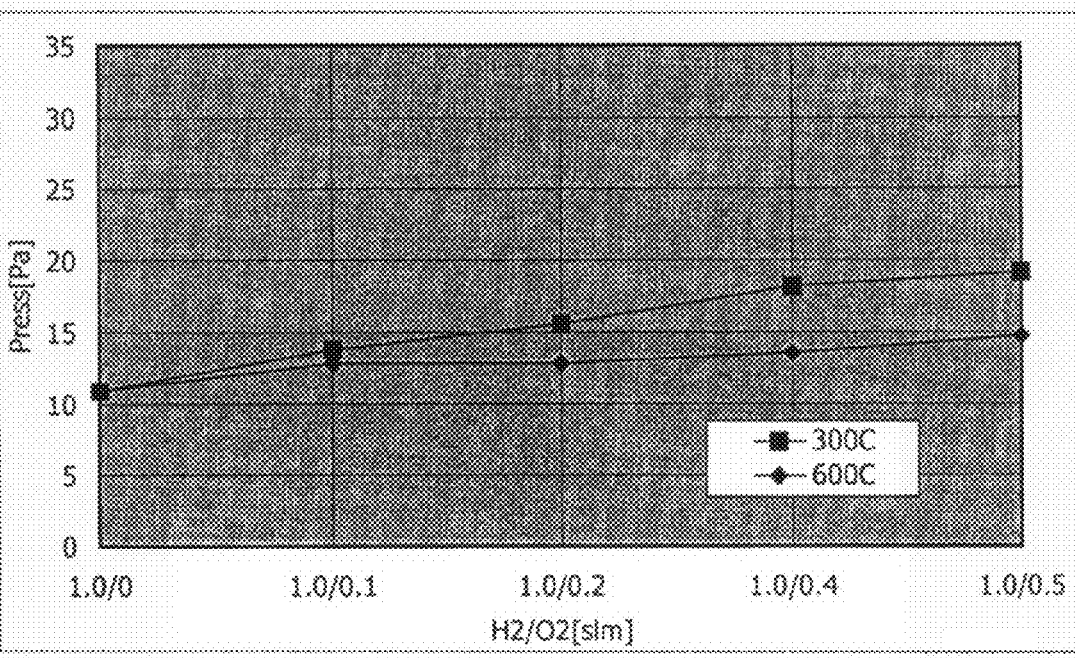
FIG. 6 is a diagram showing pressure fluctuations inside the furnace in a case in which $H_2$ and $O_2$ were supplied to the furnace with the $H_2/O_2$ flow rate ratio varied.

1 Silicon wafer (substrate)
3 Vacuum pump
4 Processing chamber
7 Oxygen supply line (oxygen-containing gas supply line)
8 Hydrogen supply line (hydrogen-containing gas supply line)
12a, 12b Mass flow controllers 23 Exhaust line
24 Control means

The invention claimed is:

1. A manufacturing method of a semiconductor device comprising the steps of:
loading a substrate into a processing chamber;
supplying a hydrogen-containing gas and an oxygen-containing gas into said processing chamber, and subjecting a surface of said substrate to oxidation processing; and
loading said substrate subjected to oxidation processing out of said processing chamber; wherein,
in said oxidation processing step, a pressure inside said processing chamber is set at a pressure that is less than atmospheric pressure, the hydrogen-containing gas is introduced in advance into said processing chamber, and the oxygen-containing gas is then introduced in a state in which the introduction of the hydrogen-containing gas is continued.

2. The manufacturing method of a semiconductor device according to claim 1, said oxidation processing step comprising the steps of:
increasing a temperature inside the processing chamber to a processing temperature from a temperature at the time at which the substrate is loaded;
maintaining the temperature inside the processing chamber at the processing temperature; and
lowering the temperature inside the processing chamber from the processing temperature to a temperature at the time at which the substrate is unloaded; wherein
the introduction of said hydrogen-containing gas is performed at least from the step of increasing the temperature inside the processing chamber, and the introduction of the oxygen-containing gas is performed at least during the step of maintaining the temperature inside the processing chamber at the processing temperature.

3. The manufacturing method of a semiconductor device according to claim 1, said oxidation processing step comprising the steps of:
increasing a temperature inside the processing chamber to a processing temperature from a temperature at the time at which the substrate is loaded;
maintaining the temperature inside the processing chamber at the processing temperature; and
lowering the temperature inside the processing chamber from the processing temperature to a temperature at the time at which the substrate is unloaded; wherein
the introduction of said hydrogen-containing gas is performed from a point prior to the step of increasing the temperature inside the processing chamber, and the introduction of the oxygen-containing gas is performed at least during the step of maintaining the temperature inside the processing chamber at the processing temperature.

4. The manufacturing method of a semiconductor device according to claim 1, wherein the pressure inside the processing chamber at the time that said hydrogen-containing gas is introduced in advance in said oxidation processing step is set at a value that is greater than the pressure at the time at which the oxygen-containing gas is introduced in a state in which the introduction of said hydrogen-containing gas is continued in the oxidation processing step.

5. The manufacturing method of a semiconductor device according to claim 1, wherein at least a layer that contains silicon atoms but does not contain metal atoms and a layer that contains metal atoms are exposed at the surface of said substrate.

6. The manufacturing method of a semiconductor device according to claim 5, wherein the flow rate ratio B/A of the flow rate B of said hydrogen-containing gas to the flow rate A of said oxygen-containing gas is set at 2 or greater in said oxidation processing step.

7. The manufacturing method of a semiconductor device according to claim 6, wherein the pressure inside said processing chamber when said oxygen-containing gas is introduced in a state in which the introduction of said hydrogen-containing gas is continued in said oxidation processing step is set at 1333 Pa (10 torr) or less.

8. The manufacturing method of a semiconductor device according to claim 5, wherein, in said oxidation processing step, said hydrogen-containing gas is introduced in advance into said processing chamber, said oxygen-containing gas is then introduced in a state in which the introduction of said hydrogen-containing gas is continued, and the introduction of said oxygen-containing gas is subsequently stopped in the state in which the introduction of said hydrogen-containing gas is continued.

9. The manufacturing method of a semiconductor device according to claim 5, said oxidation processing step comprising the steps of:
increasing a temperature inside the processing chamber to a processing temperature from a temperature at the time at which the substrate is loaded;
maintaining the temperature inside the processing chamber at the processing temperature; and
lowering the temperature inside the processing chamber from the processing temperature to a temperature at the time at which the substrate is unloaded; wherein
the introduction of said hydrogen-containing gas is continued at least from the step of increasing the temperature inside the processing chamber to the point at which the step of lowering the temperature inside the processing chamber is completed, and the introduction of said oxygen-containing gas is performed at least during the step of maintaining the temperature inside the processing chamber at the processing temperature.

10. The manufacturing method of a semiconductor device according to claim 5, said oxidation processing step comprising the steps of:
increasing a temperature inside the processing chamber to a processing temperature from a temperature at the time at which the substrate is loaded;
maintaining the temperature inside the processing chamber at the processing temperature; and
lowering the temperature inside the processing chamber from the processing temperature to a temperature at the time at which the substrate is unloaded; wherein
the introduction of said hydrogen-containing gas is continued from a point prior to the step of increasing the temperature inside the processing chamber to a point following the step of lowering the temperature inside the processing chamber, and the introduction of said oxygen-containing gas is performed at least during the step of maintaining the temperature inside the processing chamber at the processing temperature.

11. The manufacturing method of a semiconductor device according to claim 5, wherein said layer that contains silicon atoms but does not contain metal atoms is at least one layer selected from the group including a silicon single crystal substrate, a polycrystalline silicon film (poly-Si film), a silicon nitride film ($Si_3N_4$ film), and a silicon dioxide film ($SiO_2$ film), and said layer that contains metal atoms is at least one layer selected from the group including a silicide film, a metal film, and a metal oxide film.

12. A manufacturing method of a semiconductor device comprising the steps of:

loading into a processing chamber a substrate in which at least a layer that contains silicon atoms but does not contain metal atoms and a layer that contains metal atoms are exposed at the surface;

supplying a hydrogen-containing gas and an oxygen-containing gas into said processing chamber, and subjecting a surface of said substrate to oxidation processing; and unloading said substrate subjected to oxidation processing from said processing chamber; wherein, in said oxidation processing step, a pressure inside said processing chamber is set at a pressure that is less than atmospheric pressure, and a flow rate ratio B/A of a flow rate B of the hydrogen-containing gas B to a flow rate A of the oxygen-containing gas is set at 2 or greater.

13. The manufacturing method of a semiconductor device according to claim 12, wherein the pressure inside said processing chamber and said flow rate ratio B/A in said oxidation processing step are set in a range in which only said layer that contains silicon atoms but does not contain metal atoms is selectively oxidized without any oxidation of said layer that contains metal atoms.

14. The manufacturing method of a semiconductor device according to claim 12, wherein, in said oxidation processing step, the pressure inside said processing chamber is set at 1333 Pa (10 torr) or less, and said flow rate ratio B/A is set at 2 or greater.

15. The manufacturing method of a semiconductor device according to claim 12, wherein, in said oxidation processing step, the pressure inside said processing chamber is set at 1333 Pa (10 torr) or less, and said flow rate ratio B/A is set at a value ranging from 2 or greater to 5 or less.

* * * * *